US012625177B2

(12) United States Patent
     Thakur et al.

(10) Patent No.:     US 12,625,177 B2
(45) Date of Patent:        May 12, 2026

(54) AUTOMATIC BOARD PROBING STATION

(71) Applicant: Nvidia Corporation, Santa Clara, CA (US)

(72) Inventors: Akhilesh Sandeep Thakur, Portland, OR (US); Ryan Kelsey Albright, Beaverton, OR (US); Frans Johannes Fourie, Portland, OR (US); Jorian Matias Bruslind, Beaverton, OR (US); Kevin Matthew Hoser, Portland, OR (US); Zachary Jacob Watkins, Hillsboro, OR (US); Audrey Grace Cummings, Hillsboro, OR (US); Jose Eduardo Barcenas, Portland, OR (US); Daniel Garanton, Hillsboro, OR (US); Grant Michael Skidmore, Portland, OR (US)

(73) Assignee: Nvidia Corporation, Santa Clara, CA (US)

( * ) Notice: Subject to any disclaimer, the term of this patent is extended or adjusted under 35 U.S.C. 154(b) by 210 days.

(21) Appl. No.: 18/110,572

(22) Filed: Feb. 16, 2023

(65) Prior Publication Data

US 2024/0280629 A1     Aug. 22, 2024

(51) Int. Cl.
     *G01R 31/28*        (2006.01)
     *G01R 1/073*        (2006.01)
     *G01R 35/00*        (2006.01)

(52) U.S. Cl.
     CPC ..... *G01R 31/2808* (2013.01); *G01R 1/07364* (2013.01); *G01R 1/07392* (2013.01); *G01R 31/2806* (2013.01); *G01R 35/005* (2013.01)

(58) Field of Classification Search
     CPC ........... G01R 31/2808; G01R 1/07364; G01R 1/07392; G01R 31/2806; G01R 35/005
     See application file for complete search history.

(56) References Cited

U.S. PATENT DOCUMENTS

| | | | | |
|---|---|---|---|---|
| 5,850,146 A * | 12/1998 | Shim | ................. | G01R 1/06705 |
| | | | | 324/763.01 |
| 10,852,322 B1 * | 12/2020 | Rosas | ............... | G01R 1/07342 |
| 11,047,879 B2 * | 6/2021 | Fisher | ............... | G01R 1/06794 |
| 2014/0375346 A1 * | 12/2014 | Ou Yang | ........... | G01R 31/2834 |
| | | | | 324/754.03 |

* cited by examiner

*Primary Examiner* — Amy He

(74) *Attorney, Agent, or Firm* — Hogan Lovells US LLP

(57)            ABSTRACT

Systems and methods herein are for an automatic board probing station in which a plurality of probe tips are associated with a plurality of probe arms and with a plurality of motorized connectors, where the plurality of motorized connectors is to cause individual ones of the plurality of probe tips and individual ones of the plurality of probe arms to be movable independently, and where the plurality of probe tips is to communicate probe signals with a circuit analysis system and is to concurrently probe a plurality of probe points of a circuit board.

20 Claims, 7 Drawing Sheets

300

Adapter 206

Controller 208

312

212A

210A

212B

210B

212C

124A 310
308

214

302

304

306

X

Y

X

Y

X

Y

X

Y

AUTOMATIC BOARD PROBING STATION

TECHNICAL FIELD

At least one embodiment pertains to probe stations for signal integrity validation. For example, probe tips associated with probe arms and motorized connectors enable independent movement of probe tips to concurrently probe multiple probe points of a circuit board.

BACKGROUND

Circuit boards, such as baseboards, may include sockets and supporting circuitry and components for processing units to be used in a computer system. The sockets may be central processing unit (CPU) sockets, graphics processing unit (GPU) sockets, and memory sockets or slots. Such circuit boards may be tested to ensure operations to expectations or repeatability. A probe station may be used to probe the circuit boards at different probe points and to enable probe signals from such probe points to be received in a circuit analysis system, such as an oscilloscope or a source measurement unit. A probe may include a needle-like interface, also referred to herein as a probe tip, to be rested against the probe point. Under proper (such as expected) stimulation, electrically, a probe signal may be returned to the probe. The stimulation and the probe signal may be displayed or analyzed in the circuit analysis system. An analysis of one or more of such probe signals may be used to qualify a circuit board, a component, or an interconnection of the circuit board. Signal integrity validation may be performed as part of the analysis. Furthermore, a probe may be a mechanically active probe or a mechanically passive probe. A mechanically passive probe may use a tungsten needle an apply and receive signals as provided to it, whereas a mechanically active probe may use a transistor (such as a field effect transistor) near a probe tip to change a loading on an interconnection or a component of the circuit board under probe. There may be 200 to 300 probe points on a baseboard. The probe tips are coupled to oscilloscope and measurements may be taken at the individual probe points.

DETAILED DESCRIPTION

Figure 1:
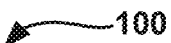
FIG. 1 illustrates a system that is subject to embodiments of an automatic board probing station.

FIG. 1 illustrates a system 100 that is subject to embodiments of an automatic board probing station, as detailed herein. The system 100 includes a probe station 102 to load and secure a circuit board 118. The circuit board 118 may be a baseboards and may include circuitry, CPUs, GPU, and memory (all generally in reference numeral 126) installed within sockets or slots or provided with associations to probe points 122. Such a circuit board 118 may be tested to ensure operations to expectations or repeatability.

The probe station 102 may be used to probe the circuit board 118 at the different probe points 122 and enable probe signals from such probe points to be provided to a circuit analysis system 104. A probe 124 may include a needle-like interface, also referred to herein as a probe tip 124A, to be rested against the probe point 122. Under proper (such as expected) stimulation, electrically, a probe signal may be returned to the probe. The stimulation and the probe signal (generally referenced in reference numeral 128) may be displayed or analyzed 112 in a circuit analysis system 104, such as an oscilloscope or a source measurement unit.

An analysis of one or more of such probe signals may be used to qualify a circuit board 118, a component 126, or an interconnection (such as between probe points 122) of the circuit board 118. The qualification of a circuit board 118, a component 126, or an interconnection may be part of a signal integrity validation performed within the analysis of the probe signals. As there are between 200 to 300 probe points on a circuit board 118, measurements are to be taken at the individual probe points 122. Further, for repeatability, the measurements may need to be repeated for each of such 200 to 300 probe points.

The system and method herein can address where, using a probe 124, there is a limit to the capability to the number of probe points 122 that can be probed at any point in time. For example, as there is a requirement to apply pressure on each probe point 122 on the circuit board 118 and because such pressure may be different in each application based in part by the person or process performing the probe, there may be change in the measurements reflected in the probe signals. In another example, where there is limited room to provide a probe tip, probe wires 160 can be soldered to multiple probe points 122 and a provision 114 may be used instead to retrieve probe signals via a connector 110 or a direct connection between the provision 114 and the circuit analysis system 104 via input ports 106. However, this leads to additional inaccuracies as a result of the soldering, such as causing additional capacitance in the probe signal that can result in warping of the probe signal.

In at least one embodiment, during bring-up, debugging, validation, and manufacturing, probing may be needed for hundreds of probe points 122. This involves lots of rework, probe wires 108, and man hours to perform. Further, the system and method herein can reduce these requirements and, in particular, can reduce wiring and manual probing which generally tends to be cumbersome for a tester. The probe points 122 on a circuit board 118 may be very small and may be difficult to contact constantly and under a proper amount of force or pressure required for the probe signal to be consistently retrieved. In addition, repetitive measurements to be performed manually takes lots of hours which in turn takes months to complete one type of validation for a circuit board 118.

Figure 2:
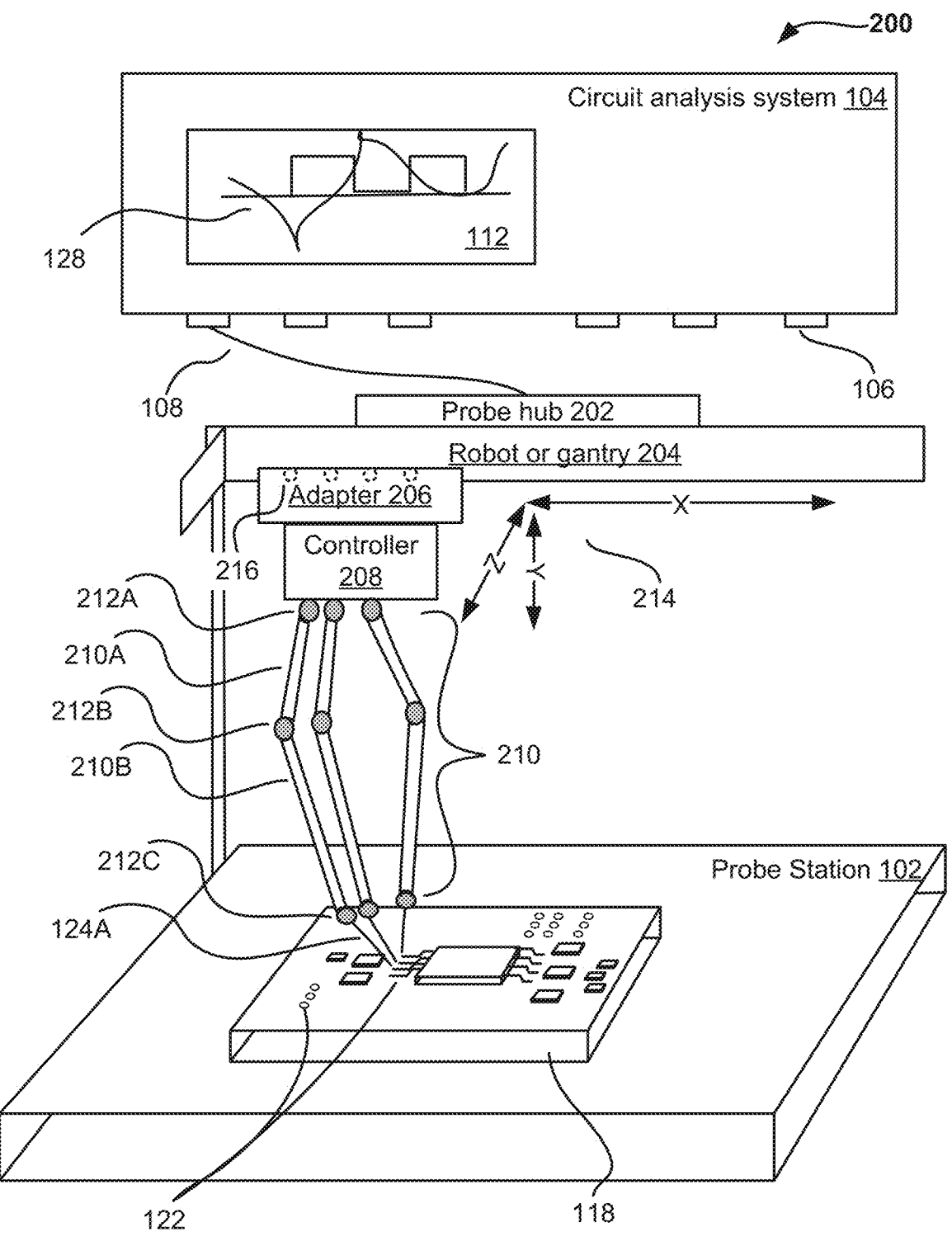
FIG. 2 illustrates aspects of a system associated with an automatic board probing station, according to at least one embodiment.

The system and method herein can address such issues by a probing station 102 that is, instead, connected to a robot or gantry, which is detailed further with respect to at least FIG. 2. The probing station 102 is associated with multiple probe tips that are in turn associated with multiple probe arms. For example, each probe arm is associated with a probe tip 124A. There may be multiple probe branches in each probe arm to increase a degrees of freedom (DOF) allowable to a probe tip 124A. Further, each probe branch and, generally, a probe arm may be associated with a motorized connector. All such motorized connectors can cause individual ones of probe tips and individual ones of the probe arms to be movable independently. In addition, all such probe tips can communicate probe signals with a circuit analysis system and can concurrently do so to probe multiple probe points 122 of a circuit board 118.

This system and method herein allow all probe points 122 to be probed within a couple of minutes and allows repeatability for such a process. In at least one embodiment, the system and method herein also support automated board probing for any type of board because multiple probe tips can access multiple probe points independently and concurrently. In addition, there is improved accuracy of probing using the system and method, in at least one embodiment, because of use of a calibration approach to initially calibrate a first probe tip 124A using a first probe point 122. However, multiple probe points may be used in calibration using the first probe tip 124A.

Then, a quality of a probe information from the calibration, such as a pressure or force to be applied and a length of time of application by a first probe point, may be used with the remaining probe points in a probe station having such automation capability. Application of the same quality associated with the calibration, such as from a first probe tip to all probe tips 124A, is so that each probe tip 124A can probe a respective probe point 122 with a same (such as, with an equal) amount of force or pressure. Still further, a threshold of a calibrated force or pressure is allowed from the calibration to allow for limited variation in a system and method herein.

FIG. 2 illustrates aspects of a system 200 associated with an automatic board probing station, according to at least one embodiment. The system 200 is for an automatic board probing station 102. The system 200 includes multiple probe tips 124A associated with multiple probe arms 210. There may be multiple probe branches 210A; 210B in individual ones of the probe arms 210. Further, the multiple probe tips 124A are associated with multiple motorized connectors 212A; B; C. These motorized connectors 212A; B; C can cause individual ones of the probe tips 124A and individual ones of the probe arms 210 to be movable independently. Further, the probe tips 124A can communicate probe signals (generally referenced by reference numeral 128) with a circuit analysis system 104. The communication of the probe signals 128 from the probe tips 124A occur concurrently, which reflects that the probe of the circuit board 118 is so that multiple probe points 122 of a circuit board 118 are probed concurrently.

In at least one embodiment, a robot or gantry 204 is provided to mount a controller 208. The controller 208 may be associated with one or more of the motorized connectors 212A; B; C. However, in at least one embodiment, the controller 208 may be associated with a motorized connector 212A at a top in each of the probe arms 210. In at least one embodiment, in addition, the controller 208 can cause the robot or gantry 204 to move multi-axially 214, such as by movement signals to the adapter 206. Further, in at least one embodiment, the controller 208 can cause movement signals to the motorized connectors 212A; B; C so that the movement signals can cause individual ones of the probe tips 124A and individual ones of the probe arms 210 to be movable independently in multi-axial directions 314C (in FIG. 3).

In at least one embodiment, a probe hub 202 can communicate the probe signals between the probe points 122 and the circuit analysis system 104. In at least one embodiment, therefore, there are connecting wires through the probe branches 210A-B of the probe arms 210, through the motorized connectors 212A-C, through the controller 208, through the adapter 206, through the robot or gantry 204, and through the probe hub 202, and till the ports 106 of the circuit analysis system 104. These features 106, 202, 206-212, may be referred to as through features. In at least one embodiment, however, the connecting wires may be coupled via electrical plugs or other connectors at least of such through features to ensure connectivity and separation for replacement of such through features without the need to make-up a connecting wire at each through feature.

In at least one embodiment, the adapter 206 is one or a combination of an electrical or a mechanical adapter so that electrical coupling of the probe tips 124A to the probe hub 202 is enabled and/or so that mechanical coupling of the probe arms 210 to the robot or gantry 204. For example, the electrical and mechanical coupling are through a universal adapter or attachment that can be connected to the robot or gantry 204 on the one side and that can include or be coupled to a controller 208 on another side. The adapter 206 is mechanically able to move multi-axially 216 around an area defined at least by the entirety of the circuit board 118 under probe. In at least one embodiment, the adapter 206 may be connected to the probe points 122 through the probe tips 124A in a manner allowing establishment of a stable connection.

In at least one embodiment, the probe arms 210 (or individual probe branches 210A, B and the probe tips 124A) may further be subject to motion stabilization by virtue of the motorized controllers 212A-C being capable of dampening movement inertia. This is so that the movements of the probe tips 124A are accurate to connect to the probe points 122 without overshooting or undershooting any designated coordinates. Further, the probe station 102 can be used for board diagnostics, validation, debug, production, and manufacturing.

Figure 3:
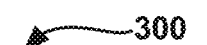
FIG. 3 illustrates further aspects of the system associated with an automatic board probing station, according to at least one embodiment.

FIG. 3 illustrates further aspects 300 of the system associated with an automatic board probing station, according to at least one embodiment. The circuit analysis system 104 may be an oscilloscope having probe wires 108 provided between ports 106 and top connectors of the probe hub 202. In at least one embodiment, the probe tips 124A are integrated with certain ones of the motorized connectors 212C or are within respective probe holders 308 of respective motorized connectors 212C. The probe holders 308 allows replacement, when needed, of probe tips 124A. In at least one embodiment, the probe tips 124A may have a first multi-axis motion 306 capability that is enabled in part by the lowest motorized connector 212C, but may have additional multi-axis motion 302, 304 that are further enabled by other motorized connectors 212A, B in the respective probe arm 210. One or more of such motorized connectors 212A-C, therefore by virtue of at least the different multi-axis motions 302-306 and in addition to the multi-axis movement 214 of the adapter 206, enable wide degrees of freedom for each probe tip 124A.

In at least one embodiment, the material used for the probe station 102 is electrostatic safe and therefore, appropriate grounding may be provided for each through feature described herein. In at least one embodiment, further hardware capabilities in the system herein may include cameras 312 and ultrasonic sensors 310 to locate the probe tip 124A accurately. In at least one embodiment, the cameras and ultrasonic sensors may be in other locations than illustrated to support the locating of one or more probe tips 124A. In at least one embodiment, the probing station 102 can support active, passive, field effect transistor (FET)-type, or any other probes to be used with one or more components of the circuit board 118.

In at least one embodiment, circuit board validation using the system 200 herein can save months of efforts put into board measurements. Further, the system 200 can be automated to a point where input is received to the adapter 206 or the controller 208 as to at least one location (or coordinate) of a probe point 122. Thereafter, the system 200 can determining other ones of the probe points 122 in the circuit board 118 for the probe tip 124A. In at least one embodiment, therefore, the input may be at most one probe point, but may include more than one probe point. The system 200 is adapted, using one or more processors as detailed in at least FIG. 4, to measure and save all the determined probe points 122 via an oscilloscope signal plot, for instance. In at least one embodiment, this approach allows for consistent and repeatable results. Further, the system 200 enables a reduction in board reworks by at least eliminating the multitude of probe wires 116, soldering in areas 120, and other aspects of using a probe 124 and using manual intervention at the probe 124.

In at least one embodiment, the system 200 herein enables a robot or gantry 204, which may be a pick and place gantry, to include a feature to mount a controller that communicates multi-axial movement to one or more of the plurality of motorized connectors. Each motorized connector may be a servo motor or a stepper motor. The server motor may include a closed-loop control system with a controller 208 and can provide feedback to enable minute distance and angle adjustments programmed to one or more processors causing multi-axial movements 302-306 and enabling instantaneous adjustments for potential or actual overshoots or undershoots.

In at least one embodiment, the controller 208 may also provide such multi-axial movements 214 through the adapter 206, through a gantry of the robot or gantry 204 provided. As such, there may be server motors or stepper motors associated with movement features 216 that allow the adapter to mechanically traverse the gantry in the multi-axial movements 214. However, in at least one embodiment, where the robot is used in the robot or gantry 204, the adapter 206 is within the robot to enable the multi-axial movements 214.

In at least one embodiment, therefore the movement features 216 are provided in each of the x, y, and z-axis to enable adapter 206 to traverse the gantry 204 in the multi-axial movements 214. Further, the movement features 216 may be wheels or other mechanically movable features that are each associated with a DC motor or actuator that is powered by direct current. Based at least in part on the weight or application of the connected through features, a size and voltage rating may be used to select the DC motors for each movement features 216. The DC motor is capable of fast response, under movement signals provided from the controller 208. The DC motor is capable of reverse motion as well so that the adapter 206 to perform the multi-axial movements 214 in forward and reverse manners.

In at least one embodiment, although DC motors may have a lower torque rating, but one or more gears, such as in a gear box associated with the movement feature 216, enable support for heavy loads or robotic movement. The gears may be used to reduce a rate of rotation or angular velocity with an increase in torque. In at least one embodiment, the gears may be integrated into the DC motor. In at least one embodiment, the DC motor is either a brushed or a brushless-type DC motor. For example, a brushed-type DC motor may include brushes and commutators to pass current from a source to an armature of a magnetic core of the DC motor. In contrast, brushless motors are less noisy and do not wear like brushed-type DC motors.

In at least one embodiment, a DC motor can provide precision with respect to positioning. For example, based in part on a provided or determined coordinates, the controller 208 can determine if the adapter 206 is to be moved or if the motorized connectors 212A-C are to be moved to arrive at the coordinates for the multiple prove tips 124A. Further, the DC motor and the motorized connectors 212A-C can hold the coordinate till a further coordinate is received.

In at least one embodiment, the system 200 herein enables energy efficiency by causing the DC motor and the motorized connectors 212A-C to not consume power when idle, such as when holding a coordinate using, for instance, an electric braking system. However, as a result of the fast movements expected during probing, the idle time is very low.

In at least one embodiment, at least the motorized connectors 212A-C may be DC actuators capable of pulse operation with an angular accuracy, in the angular requirements, for 0.01 degrees and with a distance accuracy, in the distance requirements, for 0.1 millimeters (mm). In at least one embodiment, steppers motors may be used to cause movements in steps for at least the motorized connectors 212A-C. The steps may be in reference to angles or distance. For example, a step enabled by the stepper motor may be one or more of a multiple from the accuracy provided. In at least one embodiment, these features enable positioning and repeatability with a high torque at low velocities. Further, for at least the DC actuators, a closed-loop control may not be needed as feedback may be obtained by counting of the steps applied.

In at least one embodiment, for a stepper motor, its maximum-rated velocity may cause a torque output that is lower than that of a servo motor and the stepper motor may miss to reach a coordinate determined or provided. This may cause overshoot or undershoot and so the application in the system 200 herein may prefer a stepper motor with one of the motorized connectors 212A-C and may prefer a servo motor with the movement features 216, where the motorized connectors 212A-C can make up for the coordinates intended to be reached by the probe tips 124A.

In at least one embodiment, a probe hub 202 can communicate the probe signals between the probe points 122 and the circuit analysis system 104 in a concurrent manner. The adapter 206 may allow electrical passthrough or may provide one or more distinct electrical connectors to pass movement signals to the movement features 216 and to pass probe signals from a controller 208 to the probe hub 202. This may be also the case for the robot or gantry 204. Further, the adapter 206 is mechanically and/or electrically coupled to the controller 208 and to one or more of the probe hub 202 or the robot or gantry 204.

In at least one embodiment, the controller 208 can communicate multi-axial movement signals for the motorized connectors 212A-C to perform the multi-axial movement 302-306. The controller 208 is further able to receive input providing coordinates (such as x, y, and z-axis coordinates) for at least one of the plurality of probe points of the circuit board. For example, a mechanical drawing or image file of the circuit board 118 may be used as input to the controller 208 along with an input for at least one coordinates associated with one probe point in the mechanical drawing or image file. Then, the controller 208 can determine the remaining coordinates and can determine which of the movement features 216 or the motorized connectors 212A-C are to perform movements relative to each other and to the at least one coordinates provided.

In at least one embodiment, the provision of an input of the file and the at least one coordinate from the file may be associated with a calibration step that may be performed first in the controller 208. Then, the probing may be performed in a probing step performed subsequently in the controller 208. In at least one embodiment, separately, the calibration step may also involve determining a pressure with which one of the probe tips 124A is to contact one of the probe points 122, such as a probe point associated with the inputted at least one coordinate. The pressure may be used to determine a quality of the probe performed for the one probe tip that may be applied to all the probe tips during the probe for the circuit board 118.

In at least one embodiment, the pressure determination is associated with a good and steady probe signal received from a probe point. A measurement of a clock signal as a probe signal from a probe point associated with a clock in the circuit board 118, for instance, may be used as a calibration for all the probe tips. The measurement of the clock signal may be correlated to a pressure required to sustain the contact with the one probe tip and to sustain a steady clock signal received from the probe point. This reflects a good quality clock signal that might be used to preempt a similar good quality signal from other probe points 122 that may not be only a clock signal.

In at least one embodiment, as part of the calibration using pressure, a first pressure may be applied at the probe point with an increasing pressure in steps to determine a first predetermined pressure to be used with all the probe tips. At least step of the pressure applied, a check may be performed for the probe signal received (also referred to as a feedback). Then, when the probe signal is step (such as, not improving or degrading), then that pressure can be used with the other probe tips to ensure repeatability for probing in the present arrangement of the circuit board 118 on the probe station 102.

In at least one embodiment, therefore, a controller 208 can communicate multi-axial movement signals to one or more of the motorized connectors 212A-C based in part on the controller 208 receiving input from a user of the system 200 that provides coordinates for a first one of the probe points of the circuit board 118. The controller 208 can determine a remaining ones of the coordinates for a remaining ones of the probe points 122 of the circuit board 118. Further, in at least one embodiment, a controller 208 may be used to determine a quality of a probe by at least one of the probe points (such as a clock probe point 122 on the circuit board 118) in a calibration phase of the system 200. The controller 208 is enabled to cause the same quality of the probe to apply to the remaining probe points via the probe tips in a probing phase of the system 200.

Figure 4:
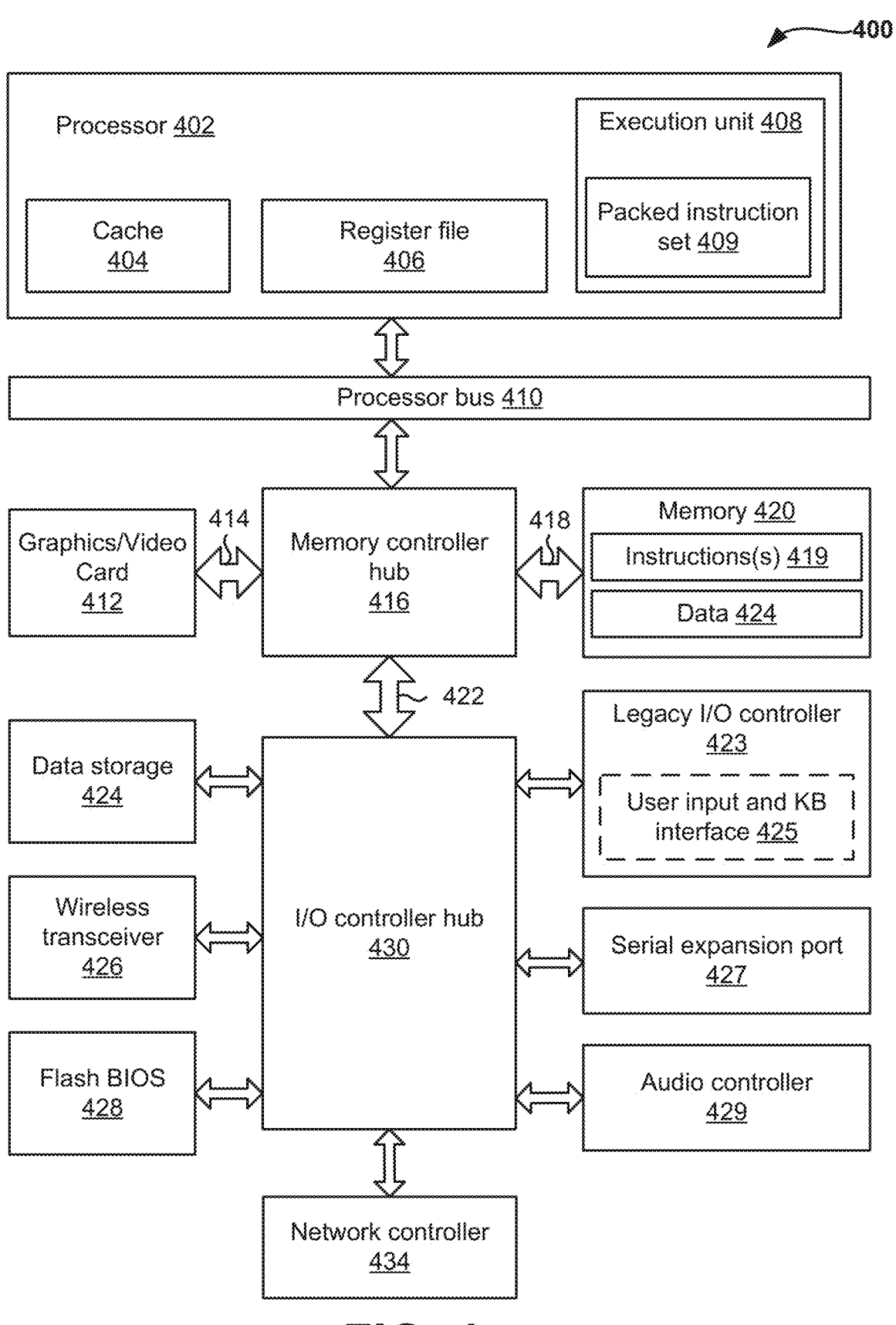
FIG. 4 illustrates computer and processor aspects of a system associated with an automatic board probing station, according to at least one embodiment.

FIG. 4 illustrates computer and processor aspects 400 of a system associated with an automatic board probing station. The computer and processor aspects may be performed by one or more processors that include a system-on-a-chip (SOC) or some combination thereof formed with a processor that may include execution units to execute an instruction, according to at least one embodiment. Further, the computer and processor aspects may be within one or more of the controller 208 or the adapter 206.

In at least one embodiment, the computer and processor aspects 400 may include, without limitation, a component, such as a processor 402 to employ execution units including logic to perform algorithms for process data, in accordance with present disclosure, such as in embodiment described herein. In at least one embodiment, the computer and processor aspects 400 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, the computer and processor aspects 400 may execute a version of WINDOWS operating system available from Microsoft Corporation of Redmond, Wash., although other operating systems (UNIX and Linux, for example), embedded software, and/or graphical user interfaces, may also be used.

Embodiments may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor ("DSP"), system on a chip, network computers ("NetPCs"), set-top boxes, network hubs, wide area network ("WAN") switches, or any other system that may perform one or more instructions in accordance with at least one embodiment.

In at least one embodiment, the computer and processor aspects 400 may include, without limitation, a processor 402 that may include, without limitation, one or more execution units 408 to perform aspects according to techniques described with respect to at least one or more of FIGS. 1-3 and 5-7 herein. In at least one embodiment, the computer and processor aspects 400 is a single processor desktop or server system, but in another embodiment, the computer and processor aspects 400 may be a multiprocessor system.

In at least one embodiment, the processor 402 may include, without limitation, a complex instruction set computer ("CISC") microprocessor, a reduced instruction set computing ("RISC") microprocessor, a very long instruction word ("VLIW") microprocessor, a processor implementing a combination of instruction sets, or any other processor device, such as a digital signal processor, for example. In at least one embodiment, a processor 402 may be coupled to a processor bus 410 that may transmit data signals between processor 402 and other components in computer system 400.

In at least one embodiment, a processor 402 may include, without limitation, a Level 1 ("L1") internal cache memory ("cache") 404. In at least one embodiment, a processor 402 may have a single internal cache or multiple levels of internal cache. In at least one embodiment, cache memory may reside external to a processor 402. Other embodiments may also include a combination of both internal and external caches depending on particular implementation and needs. In at least one embodiment, a register file 406 may store different types of data in various registers including, without limitation, integer registers, floating point registers, status registers, and an instruction pointer register.

In at least one embodiment, an execution unit 408, including, without limitation, logic to perform integer and floating point operations, also resides in a processor 402. In at least one embodiment, a processor 402 may also include a microcode ("ucode") read only memory ("ROM") that stores microcode for certain macro instructions. In at least one embodiment, an execution unit 408 may include logic to handle a packed instruction set 409.

In at least one embodiment, by including a packed instruction set 409 in an instruction set of a general-purpose processor, along with associated circuitry to execute instructions, operations used by many multimedia applications may be performed using packed data in a processor 402. In at least one embodiment, many multimedia applications may be accelerated and executed more efficiently by using a full width of a processor's data bus for performing operations on packed data, which may eliminate a need to transfer smaller units of data across that processor's data bus to perform one or more operations one data element at a time.

In at least one embodiment, an execution unit 408 may also be used in microcontrollers, embedded processors, graphics devices, DSPs, and other types of logic circuits. In at least one embodiment, the computer and processor aspects 400 may include, without limitation, a memory 420. In at least one embodiment, a memory 420 may be a Dynamic Random Access Memory ("DRAM") device, a Static Random Access Memory ("SRAM") device, a flash memory device, or another memory device. In at least one embodiment, a memory 420 may store instruction(s) 419 and/or data 421 represented by data signals that may be executed by a processor 402.

In at least one embodiment, a system logic chip may be coupled to a processor bus 410 and a memory 420. In at least one embodiment, a system logic chip may include, without limitation, a memory controller hub ("MCH") 416, and processor 402 may communicate with MCH 416 via processor bus 410. In at least one embodiment, an MCH 416 may provide a high bandwidth memory path 418 to a memory 420 for instruction and data storage and for storage of graphics commands, data and textures. In at least one embodiment, an MCH 416 may direct data signals between a processor 402, a memory 420, and other components in the computer and processor aspects 400 and to bridge data signals between a processor bus 410, a memory 420, and a system I/O interface 422. In at least one embodiment, a system logic chip may provide a graphics port for coupling to a graphics controller. In at least one embodiment, an MCH 416 may be coupled to a memory 420 through a high bandwidth memory path 418 and a graphics/video card 412 may be coupled to an MCH 416 through an Accelerated Graphics Port ("AGP") interconnect 414.

In at least one embodiment, the computer and processor aspects 400 may use a system I/O interface 422 as a proprietary hub interface bus to couple an MCH 416 to an I/O controller hub ("ICH") 430. In at least one embodiment, an ICH 430 may provide direct connections to some I/O devices via a local I/O bus. In at least one embodiment, a local I/O bus may include, without limitation, a high-speed I/O bus for connecting peripherals to a memory 420, a chipset, and processor 402. Examples may include, without limitation, an audio controller 429, a firmware hub ("flash BIOS") 428, a wireless transceiver 426, a data storage 424, a legacy I/O controller 423 containing user input and keyboard interfaces 425, a serial expansion port 427, such as a Universal Serial Bus ("USB") port, and a network controller 434. In at least one embodiment, data storage 424 may comprise a hard disk drive, a floppy disk drive, a CD-ROM device, a flash memory device, or other mass storage device.

In at least one embodiment, FIG. 4 illustrates computer and processor aspects 400, which includes interconnected hardware devices or "chips", whereas in other embodiments, FIG. 4 may illustrate an exemplary SoC. In at least one embodiment, devices illustrated in FIG. 4 may be interconnected with proprietary interconnects, standardized interconnects (e.g., PCIe) or some combination thereof. In at least one embodiment, one or more components of the computer and processor aspects 400 that are interconnected using compute express link (CXL) interconnects.

In at least one embodiment, the computer and processor aspects 400 having one or more processing units may be used in a system to communicate probe signals with a circuit analysis system. This enables concurrent probing of multiple probe points of a circuit board. The multiple probe points may be probed concurrently by individual probe tips that are associated with individual probe arms. Further, individual ones of the probe tips and individual ones of the probe arms can be movable independently using motorized connectors that receive signals from at least a controller that may be enabled by the computer and processor aspects 400.

In at least one embodiment, the computer and processor aspects 400 having one or more processing units are further configured to receive input providing coordinates for a first one of the probe points of the circuit board. Further, the one or more processing units are further configured to determine remaining ones of the coordinates for remaining ones of the probe points of the circuit board. Still further, the one or more processing units are further configured to communicate multi-axial movement signals to one or more of the motorized connectors.

In at least one embodiment, the computer and processor aspects 400 having one or more processing units are further configured to determine a quality of a probe by at least one of the probe points in a calibration phase of the system. In at least one embodiment, the one or more processing units are further configured to enable the quality of the probe to apply to all of the probe tips in a probing phase of the system.

Figure 5:
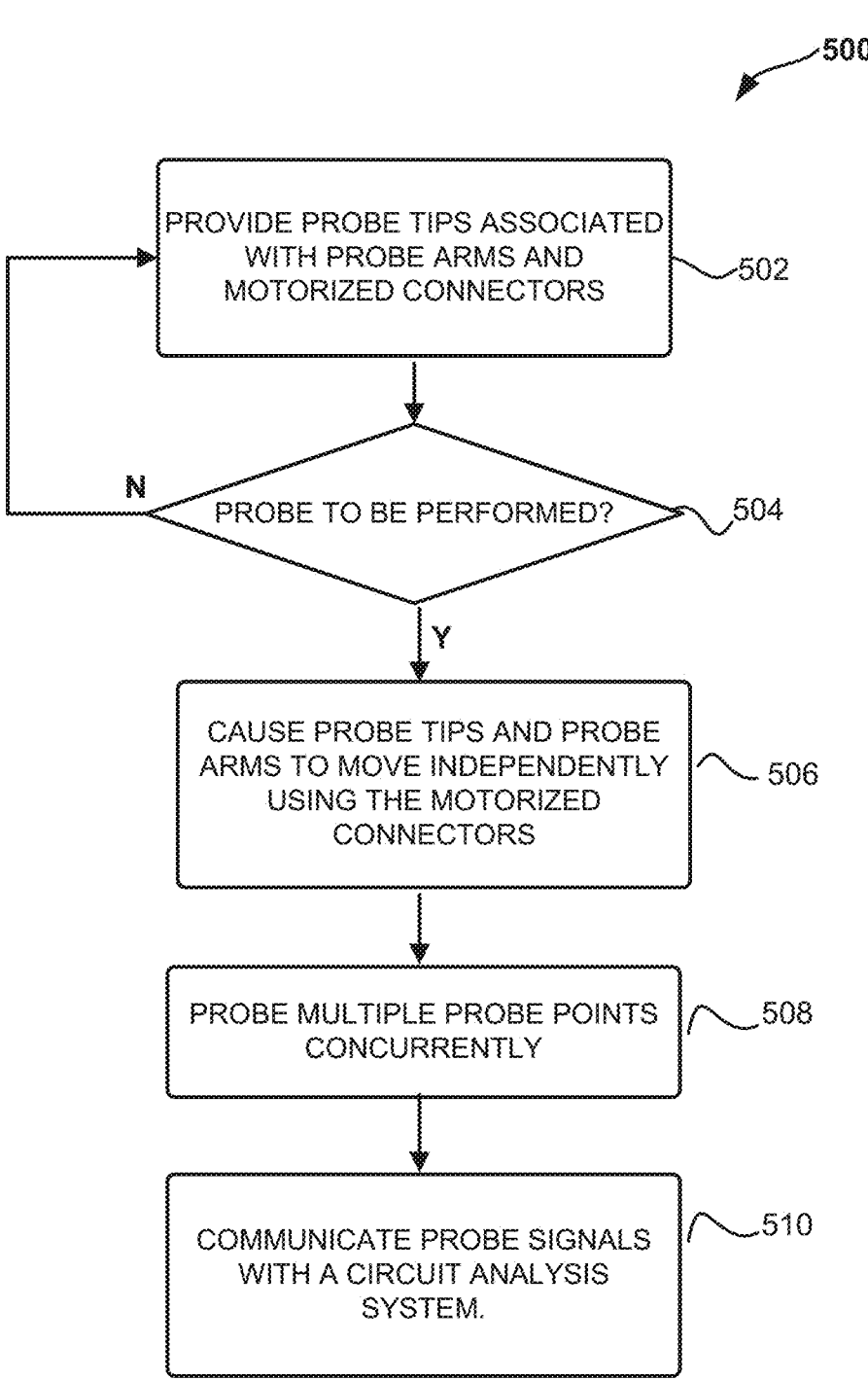
FIG. 5 illustrates a process flow for a system associated with an automatic board probing station, according to at least one embodiment.

FIG. 5 illustrates a process flow or method 500 for a system associated with an automatic board probing station, according to at least one embodiment. The method 500 includes providing (502) probe tips that are associated with probe arms and motorized connectors to be used in the probing station or probe station. This step may include either coupling together all such through features or ensuring that such through features are ready for probing.

The method 500 includes determining (504) that a probe is to be performed for a circuit board. In at least one embodiment, this step may include positioning the circuit board in a probe station and may include receiving an input to at least a controller or the adapter as related to a mechanical drawing or image file and to a coordinate (or set of coordinates) for calibrating the probe or for the probe to begin. The method 500 includes causing (506), using the motorized connectors, individual ones of the probe tips and individual ones of the probe arms to be movable independently to one or more probe points as part of the calibration and subsequently as part of the probing. The method 500 includes probing (508) multiple probe points of the circuit board concurrently using the multiple probe tips and according to the determined and input coordinates. The method 500 includes communicating (510), using the probe tips, probe signals with a circuit analysis system.

In at least one embodiment, the method 500 may include a step or a sub-step for mounting a controller on a robot or gantry. The controller may be associated with the motorized connectors, such as via electrical connectors at terminations of one or more connector cables. The controller can cause the robot or gantry to move multi-axially and can cause movement signals to the motorized connectors. The movement signals can cause the individual ones of the probe tips and the individual ones of the probe arms to be movable independently in the multi-axial directions.

Figure 6:
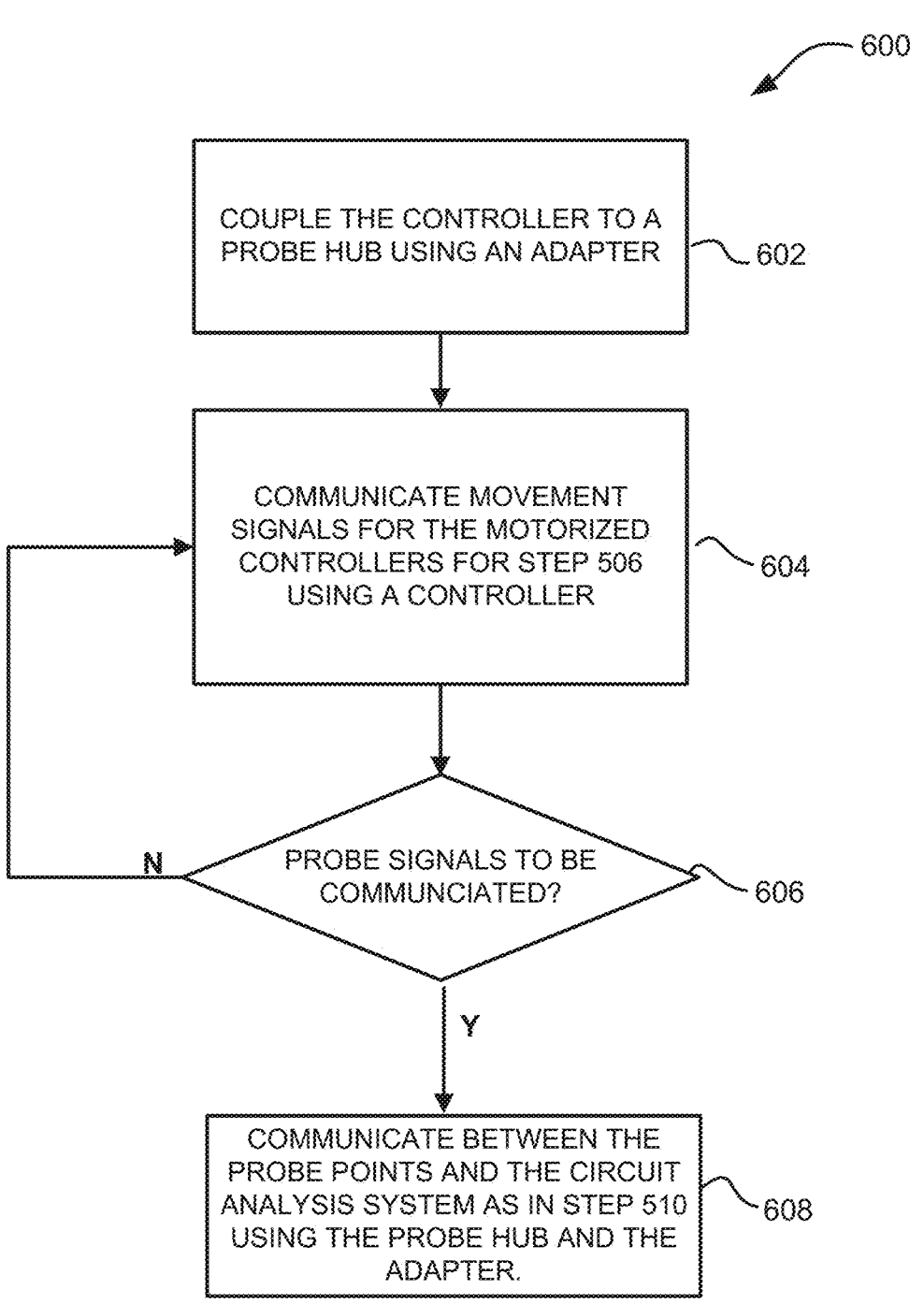
FIG. 6 illustrates yet another process flow for a system associated with an automatic board probing station, according to at least one embodiment.

FIG. 6 illustrates yet another process flow or method 600 for a system associated with an automatic board probing station, according to at least one embodiment. The method 600 includes aspects that 604, 608 that can apply to the method 500 in FIG. 5. In at least one embodiment, the method 600 includes coupling (602) the controller to one or more of a probe hub or the robot or gantry using an adapter. This may be a physical coupling or a power-on feature to enable the controller to recognize the presence of the adapter. In at least one embodiment, the physical coupling may be performed in accordance with putting together one or more through features for the probing station to perform a probe of a circuit board provided on the probing station.

In at least one embodiment, the method 600 includes communicating (604), using a controller, movement signals for multi-axial movement in one or more of the motorized connectors. This step provides underlying details to step 506 of the method 500 in FIG. 5. The method 600 includes determining or verifying (606) that probe signals are being communicated back to the network analysis system. This determining or verifying (606) may be used to ensure that the probe tips are at the intended locations. Otherwise, adjustments may be made by the communication step 604. In at least one embodiment, the method 600 includes communicating (608), using the probe hub and the adapter, the probe signals between the probe points and the circuit analysis system, as per the step 510 in FIG. 5.

In at least one embodiment, the method 600 in FIG. 6 may include a further step or a sub-step for the adapter to be further configured electrically and/or mechanically. For example, the adapter may be further configured to electrically couple the probe tips to the probe hub. The adapter may be further configured to mechanically couple the probe arms to the robot or gantry. For example, the adapter includes mechanical and electrical plug-and-play features to hang the adapter on a gantry arm, as illustrated in FIG. 2 and to electrically plug in a controller on one side and an electrical connector from the probe hub on another side. This allows for movement signals to be provided to the adapter for multi-axial movement on the gantry, on one side, and allows probe signals to be provided from the probe arms to the probe hub on the other side.

In at least one embodiment, the controller is further to electrically couple the probe tips to the adapter or the probe hub. For example, wires for the probe signals may travel within or external to the probe arms to the controller and from the controller to the probe hub through the adapter or by bypassing the adapter. In at least one embodiment, the method 600 in FIG. 6 may include a further step or a sub-step for communicating, using a controller, multi-axial movement signals to one or more of the motorized connectors. The controller can receive input that provides coordinates for at least one of the probe points of the circuit board.

Figure 7:
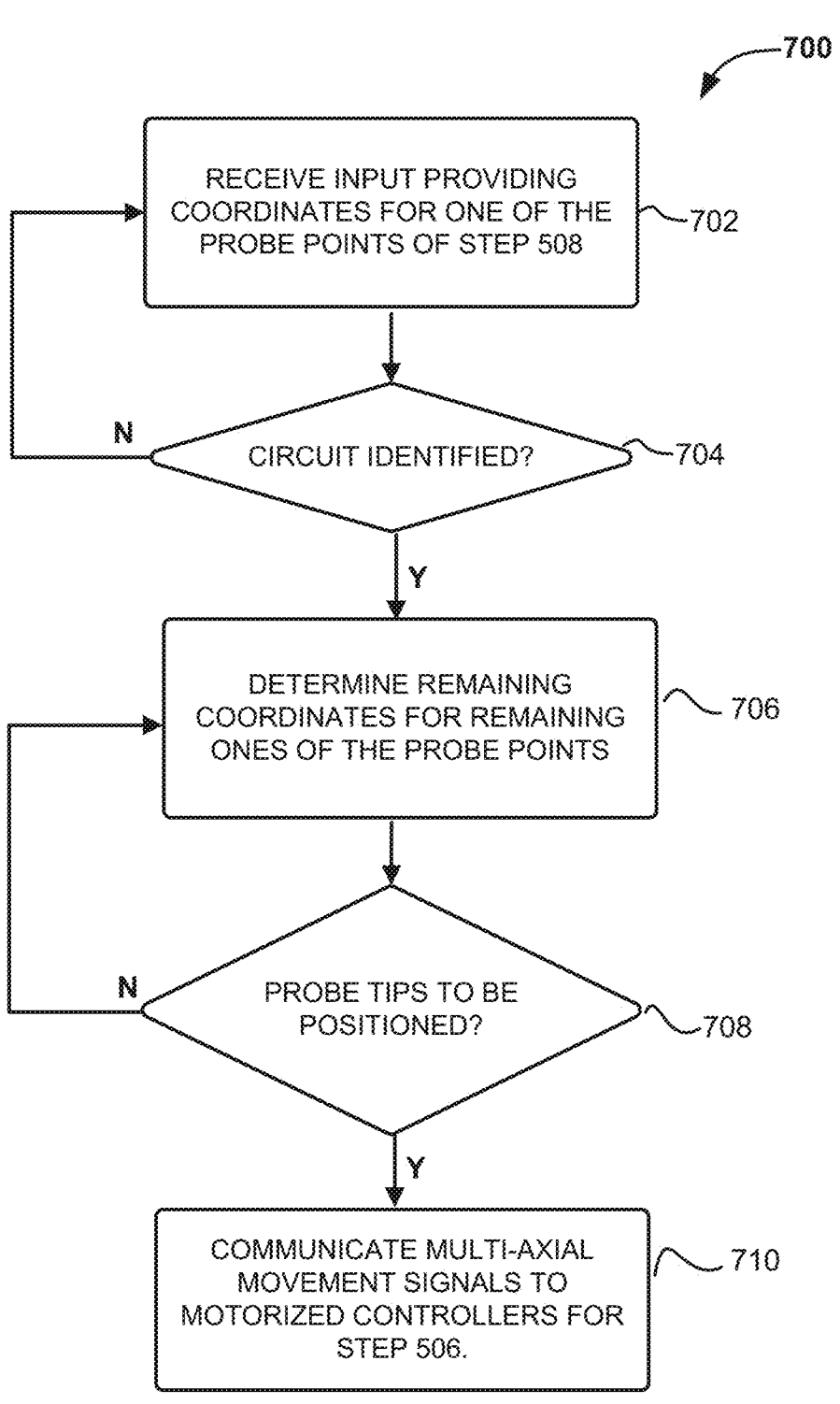
FIG. 7 illustrates a further process flow for a system associated with an automatic board probing station, according to at least one embodiment.

FIG. 7 illustrates a further process flow or method 700 for a system associated with an automatic board probing station, according to at least one embodiment. The method 700 includes receiving (702) input providing coordinates for a first one of the plurality of probe points of the circuit board. The method 700 includes determining or verifying (704) that the input allows a circuit associated with the circuit board to be probed, such as in step 504 of FIG. 5, to be identified. By such an identification, the method 700 identifies at least one probe point in a calibration step or start of a probing to be performed. In at least one embodiment, the input may be a mechanical drawing or image file or the circuit to be probed and the input may include at least one probe point identified by coordinates.

The method 700 includes determining (706), by a controller, remaining ones of the coordinates for remaining ones of the probe points of the circuit board. This may be by calculation or by inference performed in the controller, from the provided input of one coordinates for one probe point (such as a clock point) and by inference from measurements associated within the input file of the relative distances to other probe points with respect to the one probe point. The method 700 includes determining or verifying (708) that the probe tips are ready to be positioned. The method 700 includes communicating (710), using the controller, multi-axial movement signals to one or more of the motorized connectors to enable the probe tips to reach the positions determined by or input to the controller. This step (710) may be in support of the step 506 in FIG. 5.

The method 700 includes a further step or a sub-step for determining, using the controller, a quality of a probe by at least one of the plurality of probe points in a calibration phase of the system. The method 700 includes enabling the quality of the probe to apply to the plurality of probe tips in a probing phase of the system. For example, a pressure may be determined to acquire a steady clock signal at a clock probe point on the circuit board using a probe tip. Then, the same pressure may be used with all the remaining probe points using the probe tips for the rest of the probing. This allows for consistency and repeatability in the verification performed using the probe station system and method herein.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. In at least one embodiment, use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). In at least one embodiment, number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in form of a computer program comprising a plurality of instructions executable by one or more processors.

In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. In at least one embodiment, set of non-transitory computer-readable storage media comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors-for example, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

In at least one embodiment, an arithmetic logic unit is a set of combinational logic circuitry that takes one or more inputs to produce a result. In at least one embodiment, an arithmetic logic unit is used by a processor to implement mathematical operation such as addition, subtraction, or multiplication. In at least one embodiment, an arithmetic logic unit is used to implement logical operations such as logical AND/OR or XOR. In at least one embodiment, an arithmetic logic unit is stateless, and made from physical switching components such as semiconductor transistors arranged to form logical gates. In at least one embodiment, an arithmetic logic unit may operate internally as a stateful logic circuit with an associated clock. In at least one embodiment, an arithmetic logic unit may be constructed as an asynchronous logic circuit with an internal state not maintained in an associated register set. In at least one embodiment, an arithmetic logic unit is used by a processor to combine operands stored in one or more registers of the processor and produce an output that can be stored by the processor in another register or a memory location.

In at least one embodiment, as a result of processing an instruction retrieved by the processor, the processor presents one or more inputs or operands to an arithmetic logic unit, causing the arithmetic logic unit to produce a result based at least in part on an instruction code provided to inputs of the arithmetic logic unit. In at least one embodiment, the instruction codes provided by the processor to the ALU are based at least in part on the instruction executed by the processor. In at least one embodiment combinational logic in the ALU processes the inputs and produces an output which is placed on a bus within the processor. In at least one embodiment, the processor selects a destination register, memory location, output device, or output storage location on the output bus so that clocking the processor causes the results produced by the ALU to be sent to the desired location.

Accordingly, in at least one embodiment, computer systems are configured to implement one or more services that singly or collectively perform operations of processes described herein and such computer systems are configured with applicable hardware and/or software that allow performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. In at least one embodiment, process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. References may also be made to providing, outputting, transmitting, sending, or presenting analog or digital data. In at least one embodiment, processes of providing, outputting, transmitting, sending, or presenting analog or digital data can be accomplished by transferring data as an input or output parameter of a function call, a parameter of an application programming interface or interprocess communication mechanism.

Although descriptions herein set forth example implementations of described techniques, other architectures may be used to implement described functionality, and are intended to be within scope of this disclosure. Furthermore, although specific distributions of responsibilities may be defined above for purposes of description, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system for probing a circuit board, comprising:
a controller mounted on a gantry, the controller to move multi-axially on the gantry;
a plurality of probe arms mechanically connected to the controller, each probe arm extending from the controller and comprising a plurality of arm branches;
a plurality of probe tips to communicate probe signals with a circuit analysis system and to concurrently probe a plurality of probe points of the circuit board; and a plurality of motorized connectors operated by the controller to allow independent movement of the plurality of arm branches and probe tips, comprising:
a first motorized connector to mechanically connect a first arm branch to the controller,
a final motorized connector to mechanically connect a final arm branch to a probe tip, and
a plurality of intermediate motorized connectors connecting a plurality of intermediate arm branches.

2. The system of claim 1, further comprising:
a robot or the gantry to mount the controller, the controller to cause the robot or the gantry to move multi-axially and to cause movement signals to the plurality of motorized connectors, the movement signals to cause individual ones of the plurality of probe tips and individual ones of the plurality of probe arms to be movable independently in multi-axial directions.

3. The system of claim 1, further comprising:
a probe hub to communicate the probe signals between the plurality of probe points and the circuit analysis system.

4. The system of claim 1, further comprising:
a robot or the gantry to mount the controller that communicates multi-axial movement to one or more of the plurality of motorized connectors;
a probe hub to communicate the probe signals between the plurality of probe points and the circuit analysis system; and
an adapter to couple the controller to one or more of the probe hub or the robot or the gantry.

5. The system of claim 4, wherein the adapter is further to electrically couple the plurality of probe tips to the probe hub.

6. The system of claim 4, wherein the adapter is further to mechanically couple the plurality of probe arms to the robot or the gantry.

7. The system of claim 4, wherein the controller is further to electrically couple the plurality of probe tips to the adapter or the probe hub.

8. The system of claim 1, wherein:
the controller communicates multi-axial movement signals to one or more of the plurality of motorized connectors, wherein the controller is further to receive input providing coordinates for at least one of the plurality of probe points of the circuit board.

9. The system of claim 1, wherein:
the controller communicates multi-axial movement signals to one or more of the plurality of motorized connectors, wherein the controller is further to receive input providing coordinates for a first one of the plurality of probe points of the circuit board, and wherein the controller is further to determine remaining ones of the coordinates for remaining ones of the plurality of probe points of the circuit board.

10. The system of claim 1, further comprising:
the controller to determine a quality of a probe by at least one of the plurality of probe points in a calibration phase of the system and further to enable the quality of the probe to apply to the plurality of probe tips in a probing phase of the system.

11. A method for probing a circuit board, comprising:
providing a plurality of probe arms mechanically connected to a controller and extending from the controller, each probe arm comprising a plurality of arm branches, the controller to move multi-axially on a gantry;
providing a plurality of probe tips extending from the plurality of arm branches;

providing a plurality of motorized connectors operated by the controller to allow independent movement of the plurality of arm branches and probe tips;

causing, using the plurality of motorized connectors, individual ones of the plurality of probe tips and individual ones of the plurality of arm branches to be movable independently; and communicating, using the plurality of probe tips, probe signals with a circuit analysis system, wherein the plurality of probe tips concurrently probe a plurality of probe points of a circuit board.

12. The method of claim 11, further comprising:

mounting the controller on a robot or the gantry, the controller associated with the plurality of motorized connectors, the controller to cause the robot or the gantry to move multi-axially and to cause movement signals to the plurality of motorized connectors, the movement signals to cause the individual ones of the plurality of probe tips and the individual ones of the plurality of probe arms to be movable independently in multi-axial directions.

13. The method of claim 12, further comprising:

coupling the controller to one or more of a probe hub or the robot or the gantry using an adapter;

communicating, using the controller, movement signals for multi-axial movement in one or more of the plurality of motorized connectors; and communicating, using the probe hub and the adapter, the probe signals between the plurality of probe points and the circuit analysis system.

14. The method of claim 13, wherein the adapter is further to electrically couple the plurality of probe tips to the probe hub, wherein the adapter is further to mechanically couple the plurality of probe arms to the robot or the gantry, or wherein the controller is further to electrically couple the plurality of probe tips to the adapter or the probe hub.

15. The method of claim 11, further comprising:

communicating, using the controller, multi-axial movement signals to one or more of the plurality of motorized connectors, wherein the controller is to receive input providing coordinates for at least one of the plurality of probe points of the circuit board.

16. The method of claim 11, further comprising:

receiving input providing coordinates for a first one of the plurality of probe points of the circuit board;

determining, by the controller, remaining ones of the coordinates for remaining ones of the plurality of probe points of the circuit board; and communicating, using the controller, multi-axial movement signals to one or more of the plurality of motorized connectors.

17. The method of claim 11, further comprising:

determining, using the controller, a quality of a probe by at least one of the plurality of probe points in a calibration phase of the system; and enabling the quality of the probe to apply to the plurality of probe tips in a probing phase of the system.

18. A system comprising:

a plurality of probe arms; and a controller mounted on a gantry, the controller to move multi-axially on the gantry and to communicate probe signals with a circuit analysis system to enable concurrent probing of a plurality of probe points of a circuit board, the plurality of probe points to be probed concurrently by a plurality of probe tips associated with the plurality of probe arms, each of the plurality of probe tips and the plurality of probe arms to be movable independently using a plurality of motorized connectors, and each of the plurality of probe arms being mechanically connected to the controller.

19. The system of claim 18, wherein the controller is further configured to:

receive input providing coordinates for a first one of the plurality of probe points of the circuit board;

determine remaining ones of the coordinates for remaining ones of the plurality of probe points of the circuit board; and communicate multi-axial movement signals to one or more of the plurality of motorized connectors.

20. The system of claim 18, wherein the controller is further configured to:

determine a quality of a probe by at least one of the plurality of probe points in a calibration phase of the system; and enable the quality of the probe to apply to the plurality of probe tips in a probing phase of the system.

* * * * *